US00RE37477B1

(19) United States
(12) Reissued Patent
Tailliet et al.

(10) Patent Number: US RE37,477 E
(45) Date of Reissued Patent: Dec. 18, 2001

(54) INTEGRATED CIRCUIT PROTECTED AGAINST ELECTROSTATIC DISCHARGES, WITH VARIABLE PROTECTION THRESHOLD

(75) Inventors: Francois Tailliet, Epinay sur Seine; Jacek Kowalski, Trets, both of (FR)

(73) Assignee: SGS-Thomson Microelectronics, Inc., Carrollton, TX (US)

(21) Appl. No.: 08/532,011

(22) Filed: Sep. 21, 1995

Related U.S. Patent Documents

Reissue of:
(64) Patent No.: 4,890,187
Issued: Dec. 26, 1989
Appl. No.: 07/264,202
Filed: Oct. 28, 1988

U.S. Applications:
(63) Continuation of application No. 08/320,124, filed on Oct. 7, 1994, now abandoned, which is a continuation of application No. 08/149,719, filed on Nov. 9, 1993, now abandoned, which is a continuation of application No. 07/814,400, filed on Dec. 23, 1991, now abandoned.

(30) Foreign Application Priority Data

Nov. 6, 1987 (FR) ..... 87 15405

(51) Int. Cl.[7] ..... H02H 9/04
(52) U.S. Cl. ..... 361/111; 361/56; 361/91; 257/356
(58) Field of Search ..... 361/111, 56, 91; 257/356

(56) References Cited

U.S. PATENT DOCUMENTS

| | | | | |
|---|---|---|---|---|
| 3,855,605 | * | 12/1974 | Kawamoto | 357/13 |
| 4,139,935 | * | 2/1979 | Bertin et al. | 357/23.13 |
| 4,323,942 | * | 4/1982 | Hartman et al. | 361/56 |
| 4,595,941 | * | 6/1986 | Avery | 357/23.13 |
| 4,602,268 | * | 7/1986 | Hartman et al. | 357/23.13 |
| 4,712,152 | * | 12/1987 | Iio | 361/56 |
| 4,720,737 | * | 1/1988 | Shirato | 357/23.13 |
| 4,733,285 | * | 3/1988 | Ishioka et al. | 357/23.13 |
| 4,763,184 | | 8/1988 | Krieger et al. | 357/23.13 |
| 4,786,956 | * | 11/1988 | Puar | 357/23.13 |
| 4,789,917 | * | 12/1988 | Miller | 361/56 |
| 4,799,100 | * | 1/1989 | Blanchard et al. | 357/52 |
| 4,821,089 | * | 4/1989 | Strauss | 257/328 |
| 4,890,187 | * | 12/1989 | Tailliet et al. | 361/111 |

FOREIGN PATENT DOCUMENTS

0032018 * 7/1981 (EP) .

OTHER PUBLICATIONS

IBM Technical Disclosure Bulletin, vol. 23, No. 2, Jul. 1980.*

IBM Technical Disclosure Bulletin, vol. 22, No. 11, Apr. 1985.*

(List continued on next page.)

*Primary Examiner*—Todd DeBoer
(74) *Attorney, Agent, or Firm*—Felsman, Bradley, Gunter & Dillon, LLP

(57) ABSTRACT

To protect integrated circuits as efficiently as possible against electrostatic discharges, by putting a diode in avalanche mode without untimely triggering of this avalance mode by overvoltages of non-electrostatic origin, the following solution is proposed: through an insulated gate surrounding the cathode of the diode, the threshold for transition into avalanche mode of the diode is modified according to the slope of the overvoltages appearing at the terminal to be protected. The gate is connected to the terminal by an integrating circuit in such a way that the overvoltages are applied to the gate with a certain delay, inducing a potential difference between the cathode and the gate which is all the greater as the front of the overvoltage is steep. The avalanche triggering threshold is higher in the latter case than in the former one, and it is thus distinguish between overvoltages of diverse origins.

18 Claims, 2 Drawing Sheets

OTHER PUBLICATIONS

IBM Technical Disclosure Bulletin, vol. 27, No. 11, Apr. 1985.*

1987 IEEE "How to Prevent Circuit Zapping" Robert J. Antinone, BDM Corporation, pp. 34–38.

Textbook Discussion of ESD, "VLSI Engineering," Prentice Hall, 1988, Thomas E. Dillinger, pp. 508–511.

1988 IEEE/IRPS, "Failure in CMOS Circuits Induced by Hot Carriers in Multi–gate Transistors," A. Chatterjee, et al., pp. 26–28.

1988 IEEE/IRPS "Internal Chip ESD Phenomena Beyond the Protection Circuit," V. Duvvery, et al., pp. 19–25.

* cited by examiner

INTEGRATED CIRCUIT PROTECTED AGAINST ELECTROSTATIC DISCHARGES, WITH VARIABLE PROTECTION THRESHOLD

Matter enclosed in heavy brackets [ ] appears in the original patent but forms no part of this reissue specification; matter printed in italics indicates the additions made by reissue.

*This application is a continuation of application Ser. No. 08/320,124 filed Oct. 7, 1994, now abandoned, which is a continuation of application Ser. No. 08/149,719 filed Nov. 9, 1993, now abandoned, which is a continuation of application Ser. No. 07/814,400 filed Dec. 23, 1991, now abandoned, which is a Reissue of 07/264,202, now U.S. Pat. No. 4,890,187 filed Oct. 28, 1988.*

BACKGROUND OF THE INVENTION

1. Field of the Invention

The present invention concerns integrated circuits made with MOS (metal-oxide-semiconductor) technology and, more generally, integrated circuits susceptible to risks of malfunctioning or destruction in the presence of electrostatic discharges.

Electrostatic discharges may sometimes occur quite simply because a user touches the input/output terminals of the integrated circuits. This risk will become increasingly frequent as integrated circuits come into widespread use among the public, for example in the form of chip cards which will undergo a lot of handling and in which the output terminal can be directly accessed without protection.

2. Description of the Prior Art

To protect integrated circuits against these risks, it is now standard practice to provide for an element integrated in the circuit, between each of the signal terminals and the common ground terminal. The function of this element is to become suddenly conductive when overvoltage, exceeding a pre-defined threshold, appears between its terminals. This element, of course, has energy absorption or current absorption capacities which are greater than those of the other elements of the integrated circuit and, furthermore, it is designed to become conductive more quickly than the elements to be protected in the integrated circuit.

In a standard way, the protection element is a diode with its anode connected to the ground terminal and its cathode connected to another input/output terminal (assuming, of course, that the ground terminal is a negative supply terminal).

This diode stays normally off for as long as the voltage of the terminal to be protected does not go beyond an avalanche threshold. If the threshold is exceeded, the diode goes into avalanche mode and absorbs the electrostatic discharge current. It must go into avalanche mode before the other junctions, present in the integrated circuit and subject to the same overvoltage. Now, the voltage for triggering the avalanche process is essentially related to technological parameters such as the doping of the semiconducting substrate in which the circuit is formed, and the doping of the various regions diffused in this substrate.

It is difficult to have precise knowledge of the avalanche voltages of the junctions to be protected and to master the making of a protective diode with an avalanche voltage which would be below that of the junctions to be protected while, at the same time, remaining greater than the normal operating voltages of the circuit. For, it would be unacceptable for the protection element to go into a conduction state simply because a signal which has a relatively wide amplitude (but does not represent a dangerous discharge) appears at a terminal of the circuit.

Now, the specifications relating to behaviour, under voltage, of the integrated circuits are relatively strict and are finally fairly close to voltages which might damage or destroy the circuit. For example, specifications may require that the circuit should work normally if it receives signals or supply voltages of up to 15 volts, whereas the destruction threshold would be 22 volts. It must therefore be seen to it that the triggering of the protective element starts from a voltage which is considerably below 22 volts (if it is too close to 22 volts, there remains a risk of destruction because the conduction is not triggered fast enough). But it is also necessary that the protection element should be triggered for a voltage which is sufficiently greater than 15 volts (if not, there is a risk of untimely triggering below 15 volts).

The margin available for choosing the avalanche voltage is therefore narrow and it is all the smaller as technological variations are greater, i.e. it is all the smaller as the dimensions, concentrations, depths of junctions and other parameters are less well controlled in the manufacturing process.

To arrive at protection of the integrated circuits which is as efficient as possible while, at the same time, permitting normal functioning voltages which are as high as possible, the present invention proposes a new approach based on the observation that the rising edge of the overvoltages coming from electrostatic discharges (or of most overvoltages liable to appear and damage the circuits) is far steeper than the rising edge of the normal voltages (which may be relatively high) occurring at the input/output terminals of the circuit.

For, these normal voltages are either supply voltages which may exceed the value stipulated by the specifications but for which there is no reason or possibility that they should vary abruptly, or input-output logic signals which would exceptionally change to a value greater than the maximum permitted by the specifications. The rising edges of these logic signals do not exceed a few volts per nanosecond, while the rising edges of the electrostatic discharges rather have values of a some hundreds of volts per nanosecond.

SUMMARY OF THE INVENTION

According to the invention, it is proposed to connect, between two terminals of the integrated circuit, a diode associated with a means to modify the distribution of the equipotential lines at the position where the avalanche conduction of the diode is triggered, said means being connected to the terminal to be protected and being sensitive to the rising slope of the overvoltages appearing at this terminal in such a way that the avalanche triggering voltage is weaker, when the slope is steeper, than it is when the slope is less steep.

The means for modifying the distribution of equipotential lines is preferably an insulated gate surrounding an entire diffused region constituting the cathode (or anode) of the diode, and located in the immediate vicinity of this region.

This gate is connected to the terminal to be protected by an integrating circuit that introduces a time constant in such a way that an overvoltage with a steep edge reaching this terminal is transmitted with a slight delay to the gate.

For example, the gate is connected, firstly, to one end of a resistor, the other end of which is connected to the diffused region and the terminal to be protected and, secondly, to an end of a capacitor, the other end of which is connected to the other terminal of the diode.

In practice, the capacitor does not need to be given the form of a well identified circuit element, for the junction capacitances of the resistor (made by a diffused region in the substrate) and the capacitance between the gate and the semiconducting substrate in which the cathode of the diode is diffused are high enough to play the role expected of them, namely to cause a delay in the arrival of a voltage front at the gate. This delay induces a potential difference between the diffused region and the gate, which is all the greater as the front is steeper.

BRIEF DESCRIPTION OF THE DRAWINGS

Other features and advantages of the invention will appear from the following detailed description made with reference to the appended drawings, of which.

DESCRIPTION OF A PREFERRED EMBODIMENT

Figure 1:
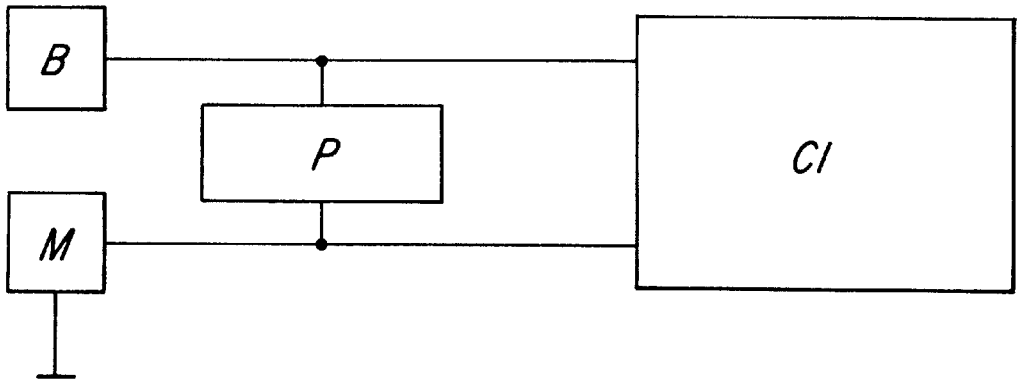
FIG. 1 gives a schematic view of an integrated circuit, one input terminal of which is protected by a protection element.

FIG. 1 gives a schematic view of an integrated circuit CI, with two input/output terminals M and B. Of course, the circuit may have other terminals which have not been shown.

The terminal M is a potential reference terminal. It is the most negative or the most positive terminal of the circuit. In the example which shall be described in the rest of the description, it is the most negative terminal, that is to say, in normal operation, the voltage at the terminal B never goes below the potential of the terminal M.

The terminal B is an input/output terminal to be protected. It may be a signal terminal receiving logic signals, or again, a positive supply terminal.

In a standard way, there is provision for a protection element P between the terminals B and M. This element behaves like a practically infinite impedance for as long as the potential difference between the terminals B and M does not exceed a threshold Vs, and then as a voltage limiter with a high current absorption capacity when this threshold is exceeded.

The invention concerns the formation of the protection element.

Figure 2:
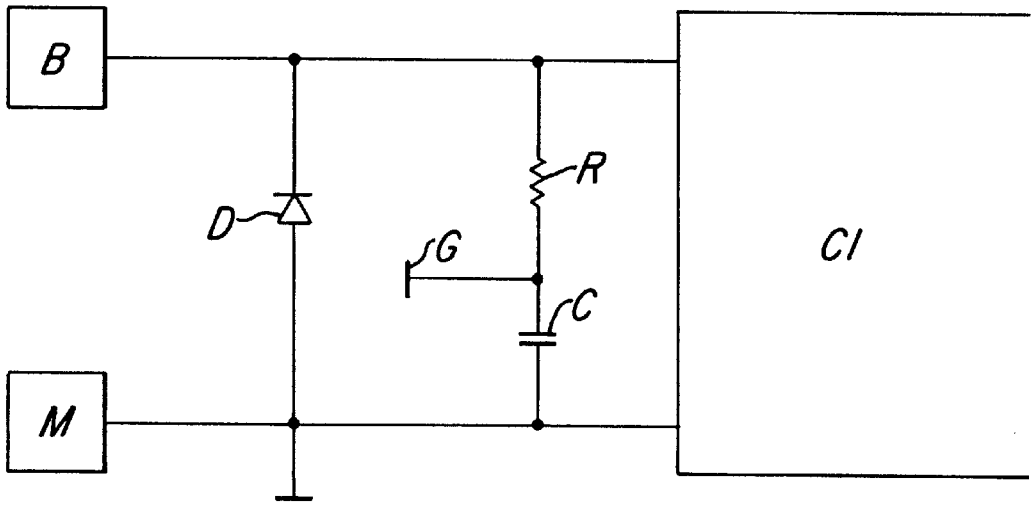
FIG. 2 gives a symbolic view of the protection device according to the invention.

FIG. 2 gives a schematic view, in symbolic form, of the operating principle of the protection element according to the invention, placed between the terminals B and M of the integrated circuit.

The protection element behaves, firstly, like a diode D, the anode of which is connected to the terminal M and the cathode to the terminal B. This diode is normally reverse biased since, as stated, the potentials present at the terminal B are greater than the reference potential M. In any case, if the potential of the terminal B drops by about 0.6 volts below the reference voltage, the diode would start conducting, preventing this fall from continuing.

When the potential of the terminal B becomes highly positive and exceeds a certain threshold Vs, the reverse biased diode D goes into the avalanche state and starts conducting.

In FIG. 2, a symbolic depiction is given, in the form of a gate G in the vicinity of the junction of the diode D, of a means to cause variation in the threshold Vs for which the diode D goes into avalanche mode. The application to the gate G of a variable potential Vg has the effect of modifying the threshold Vs.

More precisely, depending on the aim sought to be achieved according to the invention, namely the increasing of Vs if the overvoltages are simply "normal" level signals, which are slightly too high and the reducing of Vs if the overvoltages are of electrostatic origin, the gate G is connected to the terminal B by means of an integrating circuit in such a way that the potential Vg follows the potential of the terminal B with a certain delay. This circuit acts in such a way that the potential Vg remains all the closer to the potential of the terminal B as the rising time of the overvoltages applied to the terminal B are slower during the rising of the signal.

The integrating circuit is shown in the form of a resistor R and a capacitor C. The resistor R is connected between the gate and the terminal B. The capacitor C is connected between the gate G and the ground M.

The gate is placed in the vicinity of the junction of the diode D in such a way that it has an influence on the distribution of the equipotential lines inside the anode regions and cathode regions of the diode. This influence is in the following direction: the equipotential lines are more curved and more contracted in the breakdown region of the diode (the region in which the avalanche mode gets initially triggered) when the potential Vg is weaker. They are less curved and more spaced out when the potential Vg is greater.

The result of this is that the breakdown occurs for a higher voltage Vs1 when there is an overvoltage with a relatively slow rising edge and a lower voltage Vs2 when there is an overvoltage with a very steep rising edge. In both cases, the gate potential Vg ad the potential of the overvoltage on the terminal B rise and equipotential lines increase their curvature and get contracted as and when this rise occurs. But, in the latter case, the gate potential Vg is not able to follow the potential on the line B, and the curvature of the equipotential lines is even greater and their contraction is even greater than in the former case during the rising edge. The result of this is that the avalanche threshold is appreciably lower in the case of a very steep rising edge.

In an illustrative, digital example, it can be shown that with a resistance of 2 kilohms and a capacitance of 0.1 picofarad, the potential Vg will follow the potential of the terminal B with a difference of about 1 volt for rising edges of about 5 volts per nanosecond (standard value for logic signals), and a difference very swiftly reaching 40 volts for rising edges of 200 volts per nanosecond (standard value for electrostatic discharges). This difference between the two cases is quite enough to substantially modify the avalanche voltage threshold of the diode.

The invention can be implemented especially with a diffused junction diode flush with the surface of a semiconducting substrate, the surface outcrop of the junction being surrounded by or covered with an insulated conducting gate coming to the immediate vicinity of the junction throughout its periphery.

Figure 3:
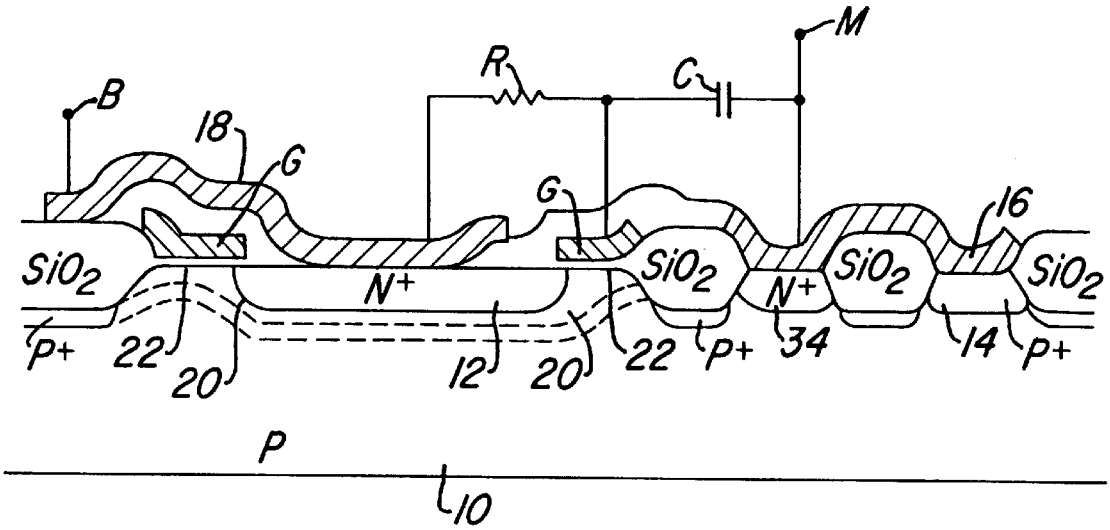
FIG. 3 shows a lateral sectional view, along the line AA of FIG. 4, of a possible structure for the protection element according to the invention.
Figure 4:
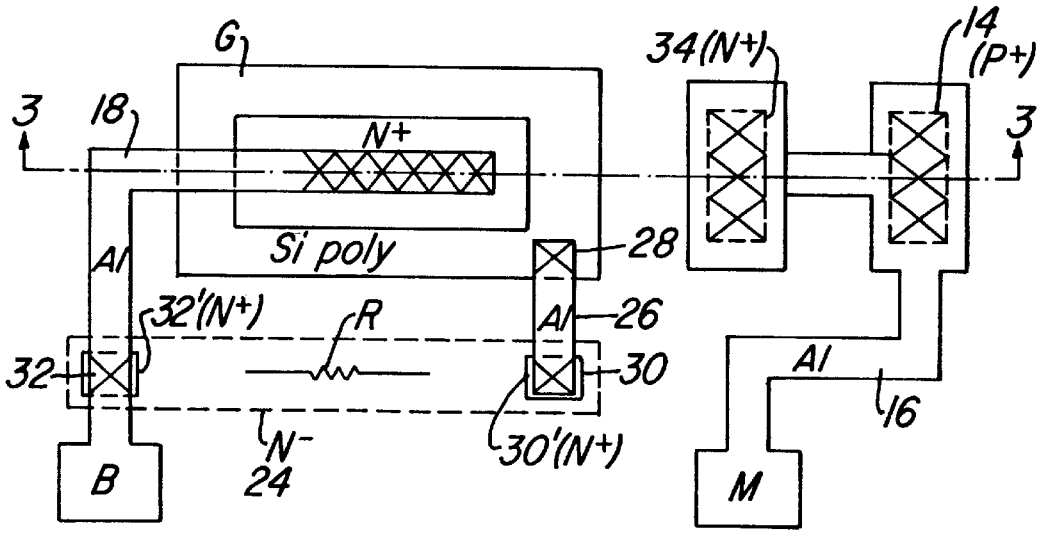
FIG. 4 shows a top view of the structure of FIG. 3 also showing the constitution of the integration resistor of FIG. 2.

FIG. 3 shows a lateral cross-section view of a structure of this type and FIG. 4 shows a top view. The section is made along the lines AA of FIG. 4. In FIG. 4, the crosses show contact zones between a conducting metallization and a sub-adjacent region.

The diode D consists of an N+ type region 12 diffused on the surface of a P type semiconducting substrate 10.

The substrate is connected to the ground M either by its rear face or by means of a P+ type region 14, locally diffused at the surface of the substrate and covered with a metallization 16 which connects it with the terminal M.

The region 12 is connected to the terminal B by a metallization 18.

The region 12 is made by local diffusion of N+ type impurities from the surface of the substrate. The junction between the region 12 and the substrate 10 thus has, as is well known, a curvature 20 along its periphery, where it rises towards the upper surface of the substrate.

It is known that it is in the region of this curvature 20 that the avalanche mode is initially triggered when the diode is subjected to a high reverse voltage. The reason for this is that the equipotential lines are highly curved and contracted in the neighbourhood of this curvature.

Sometimes also, the avalanche mode is triggered in the zone where the junction is flush with the surface of the substrate, either because the dopings are higher at the surface or as a result of faults that might exist at the surface outcrop of the junction. In this case too, the breakdown occurs in the zones where the electrical field is the highest with respect to the capacity of these zones to support this electrical field, and consequently, again in the zones where the equipotential lines are the most contracted.

The periphery of the diffused region 12 is completely surrounded by a polycrystaline silicon gate G covering the outcrop of the junction and insulated from the surface of the substrate by a thin insulating layer 22 (silicon oxide). This gate G is made by the same process as the gates of the MOS transistors of the integrated circuit and, similarly, as the gates of the MOS transistors that go slightly beyond the source and drain regions. Similarly, the gate G covers the surface outcrop of the junction in going very slightly beyond the entire periphery of the region 12.

The greater the positive potential applied to the gate G, the more the equipotential lines in the neighbourhood of the curvature of the junction 20 and the surface outcrop of the junction get loosened and, hence, the greater is the voltage Vs needed for application to the terminals of the diode D to put it in avalanche mode.

The general form of the equipotential lines in the presence of a positive voltage at the gate G is shown schematically by dashes in FIG. 3. In the presence of a null potential at the gate G, the equipotential lines remain practically parallel to the curvature 20 and rise to the surface.

The gate G is connected to the terminal B by means of a resistor R which cannot be seen in the section AA of FIG. 3 but is seen in the top view of FIG. 4. This resistor can be made by a slightly doped N type diffusion 24 in the P type substrate. A metallization 26 (FIG. 4) comes into contact in a region 28 with the gate G and, in a region 30, with an end of the diffusion 24. Another end of the diffusion 24 is connected by a contact zone 32 with the metallization 18, hence with the terminal B. The contacts 30 and 32 are formed on top of the small N+ type regions 30' and 32' diffused at the ends of the resistor 24.

The capacitance value of C of the diagram of FIG. 2 is simply the existing capacitance between the gate and the substrate P, connected to the ground as well as between the region 24 and the substrate. This capacitance can easily reach 0.1 picofarads because the gate G is separated from the substrate only by a very small thickness of insulating material (a few hundreds of angstroms at the most). It is not necessary then to add a specific capacitance to arrive at the diagram of FIG. 2.

The resistance R may have a value of a few kilohms.

In FIGS. 3 and 4, there is also shown an N+ type diffused surface region 34, laterally spaced from the diode D and connected to the ground M by an extension of the metallization 16.

Thus, between the cathode of the diode (region 12), the substrate 10 and the region 34 there is formed an NPN type lateral bipolar transistor. This transistor makes it possible to maintain a current up to total extinction of the overvoltage (and not only until the voltage falls below the avalanche threshold V1).

What is claimed is:

1. An integrated circuit comprising at least a terminal to be protected and a reference terminal, and means for protecting the integrated circuit against overvoltages, said protecting means comprising a diode connected between said terminals, said diode capable of being set in avalanche conduction in case an overvoltage is applied between said terminals in a direction corresponding to a reverse bias of the diode, means for modifying the distribution of equipotential lines in a region where the avalanche conduction of the diode starts, said means connected to said terminal to be protected, and said means being sensitive to the rising slope of the overvoltage, in such a way that the avalanche triggering voltage is lower when the slope is steeper, and higher when the slope is less steep.

2. A device according to claim 1, wherein the means to modify the distribution of the equipotential lines comprises an insulated gate completely surrounding the periphery of a region diffused in a semiconducting substrate and connected to the terminal to be protected, the gate being connected to the terminal to be protected by means of an integrating circuit.

3. A device according to claim 2, wherein the gate is connected to the terminal to be protected by a resistor and is connected to the reference terminal by a capacitance.

4. A device according to claim 3, wherein the capacitance is the inherent capacitance between the gate and a semiconducting substrate separated from the gate by a thin insulating layer, the substrate being connected to the reference terminal.

5. A device according to any of the claims 3 or 4, wherein the resistor is a region diffused in the substrate and has a type of conductivity opposite to the substrate.

*6. In an integrated circuit having a reference terminal and an input terminal to be protected, a structure for protecting the integrated circuit against overvoltages, comprising:*

*a diode connected to the input terminal, said diode being capable of being set in avalanche conduction in case an overvoltage is applied between the input terminal and the reference terminal in a direction corresponding to a reverse bias of said diode; and*

*means for altering an avalanche threshold voltage of said diode, said altering means connected to the input terminal, and said altering means responsive to a rising slope of the input voltage to lower the diode avalanche threshold voltage when the input voltage is rising relatively fast, and raising the diode avalanche threshold voltage when the input voltage is rising relatively slowly.*

*7. The structure of claim 6, wherein said diode comprises a diffused region having a first conductivity type within a substrate having a second conductivity type, wherein a PN junction is formed between the diffused region and the substrate.*

*8. In an integrated circuit having a reference terminal and an input terminal to be protected, a structure for protecting the integrated circuit against overvoltages, comprising:*

*a diode connected to the input terminal, said diode formed from a diffused region, having a first conductivity type, within a substrate having a second conductivity type, and adjacent a surface thereof, wherein a PN junction is formed between the diffused region and the substrate, said diode further being capable of being set in avalanche conduction in case an overvoltage is applied between the input terminal and the reference terminal in a direction corresponding to a reverse bias of said diode; and*

*means for altering an avalanche threshold voltage of said diode, said altering means connected to the input terminal, and said altering means responsive to a rising slope of the input voltage to lower the diode avalanche threshold voltage when the input voltage is rising relatively fast, and raising the diode avalanche threshold voltage when the input voltage is rising relatively slowly, wherein said altering means is formed from a gate electrode overlying the PN junction adjacent to the substrate surface and separated therefrom by an insulating layer, and an integrating circuit connected to said gate and to the input terminal, wherein a charge on said gate is proportional to a change of voltage on the input terminal.*

*9. The structure of claim 8, wherein said integrating circuit comprises:*

*a resistor connected between the input terminal and said gate; and*

*a capacitor connected between said gate and the reference terminal.*

*10. In an integrated circuit having a reference terminal and an input terminal to be protected, a structure for protecting the integrated circuit against overvoltages, comprising:*

*a doped region having a first conductivity type within a substrate having a second conductivity type, wherein a PN junction is formed between said doped region and the substrate, a portion of the PN junction extending to a surface of the substrate;*

*a first conductive element connecting the doped region to the input terminal;*

*a gate element overlying the surface of the substrate adjacent the PN junction and separated therefrom by a thin insulating layer, wherein voltage applied to said gate element alters an avalanche threshold voltage of the PN junction;*

*a resistive element connecting the input terminal to said gate element; and*

*a capacitance between said gate element and the substrate.*

*11. The structure of claim 10, wherein said capacitance comprises capacitance which exists between said gate element and the substrate through the thin oxide layer.*

*12. The structure of claim 10, wherein said resistive element comprises a conductive region of the first conductivity type formed within the substrate.*

*13. The structure of claim 10, wherein the substrate is connected to the reference terminal.*

*14. The structure of claim 13, wherein the reference terminal is connected to the substrate through a second doped region within the substrate which has the first conductivity type.*

*15. The structure of claim 14, wherein the first conductivity type is N-type, and the second conductivity type is P-type, wherein the doped region, the substrate, and the second doped region together form an NPN bipolar transistor.*

*16. The structure of claim 10, wherein said resistive element and said capacitance combine to form a circuit for integrating voltages applied to the input terminal.*

*17. The structure of claim 16, wherein a rapidly changing voltage in a first direction is integrated to apply a gate voltage to said gate element, and wherein the gate voltage acts to lower the avalanche threshold voltage of the PN junction.*

*18. The structure of claim 17, wherein a slowly changing voltage in the first direction is integrated to apply a lower gate voltage to said gate element, and wherein the lower gate voltage acts to raise the avalanche threshold voltage of the PN junction.*

* * * * *

UNITED STATES PATENT AND TRADEMARK OFFICE

CERTIFICATE OF CORRECTION

PATENT NO. : Re 37,477 E
DATED : December 18, 2001
INVENTOR(S) : Francois Tailliet et al.

It is certified that error appears in the above-identified patent and that said Letters Patent is hereby corrected as shown below:

Title page,
Item [73], Assignee, please delete "SGS-Thomson Microelectronis, Inc." as the name of the Assignee of this Reissued Patent and insert -- STMicroelectronics, S.A. --

Signed and Sealed this

Sixth Day of August, 2002

*Attest:*

*Attesting Officer*

JAMES E. ROGAN
*Director of the United States Patent and Trademark Office*